(12) United States Patent
Koc et al.

(10) Patent No.: US 7,764,449 B2
(45) Date of Patent: Jul. 27, 2010

(54) PIEZOELECTRIC ACTUATOR AND LENS DRIVING DEVICE

(75) Inventors: Burhanettin Koc, Gyunggi-do (KR); Hyun Phill Ko, Gyunggi-do (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 126 days.

(21) Appl. No.: 12/155,125

(22) Filed: May 29, 2008

(65) Prior Publication Data

US 2008/0297923 A1 Dec. 4, 2008

(30) Foreign Application Priority Data

May 29, 2007 (KR) .................. 10-2007-0052088

(51) Int. Cl.
*G02B 7/02* (2006.01)
*G02B 15/14* (2006.01)

(52) U.S. Cl. .................... 359/824; 359/694

(58) Field of Classification Search ......... 359/694–700, 359/819–824; 310/323.01, 323.02, 323.06, 310/323.15
See application file for complete search history.

(56) References Cited

U.S. PATENT DOCUMENTS

| | | | |
|---|---|---|---|
| 5,768,038 A | 6/1998 | Emura | 359/824 |
| 6,215,605 B1 | 4/2001 | Kuwana et al. | 359/824 |
| 7,457,060 B2 * | 11/2008 | Paik et al. | 359/824 |
| 7,595,947 B2 * | 9/2009 | Lee et al. | 359/824 |
| 2002/0036445 A1 | 3/2002 | Iino et al. | |
| 2006/0067666 A1 | 3/2006 | Park et al. | |
| 2008/0144201 A1 * | 6/2008 | Koc et al. | 359/824 |

FOREIGN PATENT DOCUMENTS

| | | |
|---|---|---|
| JP | 11-127585 | 5/1999 |
| KR | 10-2006-0028493 | 3/2006 |

* cited by examiner

*Primary Examiner*—Mohammed Hasan

(57) ABSTRACT

There are provided a piezoelectric actuator and a lens driving apparatus having the piezoelectric actuator. The lens driving device includes: a lens barrel having a lens hole where at least one lens is disposed, and having a tip friction member on an outer surface thereof; a base having a guiding part guiding the lens barrel to move along an optical axis direction; a piezoelectric actuator having a piezoelectric body disposed at an edge of the base to apply a driving force when a power is applied, the piezoelectric body having at least one friction member at one side thereof to be in contact with the tip friction member; and a preload member applying an elastic force for elastically supporting the piezoelectric actuator against the lens barrel to keep the tip friction member and the friction member in contact with each other.

20 Claims, 14 Drawing Sheets

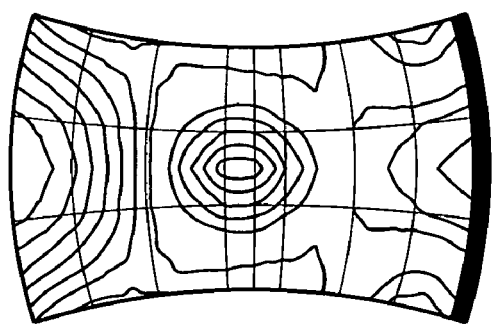 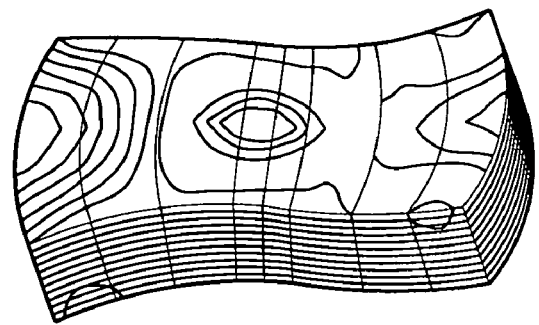
FIG. 7A                    FIG. 7B

PIEZOELECTRIC ACTUATOR AND LENS DRIVING DEVICE

CROSS-REFERENCE TO RELATED APPLICATIONS

This application claims the priority of Korean Patent Application No. 2007-52088 filed on May 29, 2007, in the Korean Intellectual Property Office, the disclosure of which is incorporated herein by reference.

BACKGROUND OF THE INVENTION

1. Field of the Invention

The present invention relates to a piezoelectric actuator and an apparatus for driving a lens applied to an optical device using the piezoelectric actuator, and more particularly, to a piezoelectric actuator which is simplified in a driving mechanism to achieve a smaller size, minimized in loss of a driving force for driving a lens and ensures more accurate and stable transport of the lens.

2. Description of the Related Art

In general, an optical apparatus includes a lens driving device for driving a lens. This lens driving device employs an actuator such as an electromagnetic motor or a piezoelectric actuator to generate a driving force, and a cam or a screw to transmit the driving force generated from the actuator.

Therefore, the lens driving device drives the lens in an optical axis direction using the driving force generated from the actuator. At this time, the lens driving device changes a relative distance between a lens and an adjacent lens thereof to perform zooming or focusing.

Meanwhile, recently, a piezoelectric actuator utilizing a piezoelectric body has been highlighted as a new motor to substitute an electromagnetic motor.

This piezoelectric actuator generates high frequency vibration of minute amplitudes in a piezoelectric vibrator and transfers these minute vibrations by contact friction between a friction member and a slider (rotor) attached to the piezoelectric vibrator, thereby enabling the slider (rotor) to perform minute motion. This piezoelectric actuator is smaller in size, higher in driving resolution and less noise-causing than the conventional electromagnetic motor.

FIG. 1 is a schematic view illustrating a structure of a conventional piezoelectric actuator. The piezoelectric actuator includes a piezoelectric body 10, and a friction member 30 attached to one side thereof.

The piezoelectric body 10 is structured such that a plurality of piezoelectric ceramic sheets formed of a plurality of ceramics are stacked, and each of the piezoelectric ceramic sheets has an internal electrode formed thereon to define the piezoelectric body into a plurality of vibrators.

These internal electrodes can be configured variously on a surface of the piezoelectric sheet considering type and direction of vibration generated from the piezoelectric body 10, and number and location of the friction member 30.

Also, wires or the external electrodes 21 and 22 are formed on the piezoelectric body 10 to connect the internal electrodes together so as to supply alternating currents of an identical phase to the two vibrators 11 and 14, and 12 and 13 located diagonally. Also, the friction member 30 is disposed on the one side surface of the piezoelectric body 10 to transfer vibration generated from the piezoelectric body 10 to the outside. The friction member 30 is made of a ceramic material or a hard metal.

Accordingly, the alternating voltages of an identical phase are applied to the two rotators 11 and 14, and 12 and 13 located diagonally through the wires or external electrodes 21 and 22 of the piezoelectric body 10 which is divided into the vibrators 11, 12, 13 and 14. Then, the piezoelectric body 10 generates vibrations of two modes.

That is, the piezoelectric body 10 generates a dilation mode of vibration for enabling dilation along a longitudinal direction and a bending mode of vibration for enabling bending in a thickness direction thereof.

With simultaneous occurrence of the vibrations of these two modes, the friction member performs elliptical motion and this elliptical motion of the friction member 30 is transferred to the slider or rotor to enable linear motion for the slider and rotational movement for the rotor.

However, the conventional piezoelectric actuator entails a complicated process of forming the external electrodes connected to the internal electrode, thus requiring high precision. This hinders simplification of a manufacturing process for saving manufacturing costs and reduction of the bulk of the piezoelectric actuator.

U.S. Pat. No. 5,768,038 discloses a device for moving a lens including a lens frame, a signal generator, a piezoelectric vibrator, a supporter, a pressure surface and a pressure member. The guiding member guides a lens frame. The signal generator generates an electrical signal. The piezoelectric vibrator moves the lens frame along the guiding member by vibration according to the electrical signal. The supporter supports the piezoelectric vibrator. The pressure surface is in pressure contact with the piezoelectric vibrator. The pressure member brings the piezoelectric vibrator into pressure contact with the pressure surface.

However, this conventional device requires the guiding member to be additionally assembled so that the lens frame is moved along an optical axis direction. This complicates an assembling structure and a process, and hinders miniaturization of the product.

Moreover, U.S. Pat. No. 6,215,605 discloses a driving device. In the driving device, piezoelectric devices are fixed to a base block and a driving force is transferred to driving rods. Then, a lens is moved by a pressure generated from a slide part, an inertial force of a lens frame and acceleration effects. The lens frame is transferred along with the driving rods according to a waveform of an input voltage or performs slidable relative motion, thereby enabling the driving device to reciprocally move the lens.

However, in this conventional device, the driving rods are fixed so that a length of barrel cannot be changed. This accordingly is an impediment to reduction in size. Also, a driving signal of the device is an asymmetrical wave signal, not a sine wave signal, thereby complicating a driving circuit.

Therefore, there is a need for a lens driving device which can be mounted in a small volume, controlled precisely due to high driving resolution, while operating with a small driving power and achieving a sufficient driving distance.

SUMMARY OF THE INVENTION

An aspect of the present invention provides a piezoelectric actuator which is simplified in a manufacturing process to save manufacturing costs and reduced in volume to ensure a smaller size.

An aspect of the present invention also provides a lens driving device which is simplified in structure to achieve a smaller size and superior in driving resolution due to a sufficient driving distance at a low input voltage, minimized in loss of a driving force, simplified in a guiding mechanism for driving a lens, and can ensure accurate and stable transport of the lens.

According to an aspect of the present invention, there is provided a piezoelectric actuator including: a piezoelectric body having first and second ceramic sheets stacked alternately in a stack direction, the first ceramic sheet having first and second internal electrodes pattern-printed to be spaced apart from each other at a predetermined distance, and the second ceramic sheet having a ground electrode pattern-printed thereon; an electrode part including a first external electrode, a second external electrode and a ground external electrode, the first external electrode formed on an outer surface of the piezoelectric body to connect to a terminal of the first internal electrode, the second external electrode formed on the outer surface of the piezoelectric body to connect to a terminal of the second internal electrode, and the ground external electrode formed on the outer surface of the piezoelectric body to connect to a terminal of the ground electrode; and a friction member disposed on the outer surface of the piezoelectric body to transfer vibration generated from the piezoelectric body to the outside.

The piezoelectric body may include: a first piezoelectric body including a multi-layer stack of the plurality of first ceramic sheets and the second ceramic sheet interposed therebetween, the plurality of first ceramic sheets each arranged such that the first internal electrode is superimposed on a first vibration part and the second internal electrode is superimposed on a second vibration part; and a second piezoelectric body comprising a multi-layer stack of the plurality of first ceramic sheets and the second ceramic sheet interposed therebetween, the plurality of first ceramic sheets each arranged such that the first internal electrode is superimposed on a second vibration part and the second internal electrode is superimposed on a first vibration part.

The piezoelectric body may further include a ceramic sheet disposed as an uppermost layer, the ceramic sheet comprising first and second channel electrodes and an internal ground electrode pattern-printed thereon, the first channel electrode connected to the first external electrode, the second channel electrode connected to the second external electrode and the internal ground electrode connected to the ground external electrode.

The friction member may be disposed on one of outer surfaces of the piezoelectric body having a maximum area.

The friction member may be disposed on a recess formed in one of outer surfaces of the piezoelectric body having a maximum area.

The terminal of the first internal electrode may oppose the terminal of the second internal electrode.

According to another aspect of the present invention, there is provided a lens driving device may include: a lens barrel having a lens hole where at least one lens is disposed, and having a tip friction member on an outer surface thereof; a base having a guiding part guiding the lens barrel to move along an optical axis direction; a piezoelectric actuator having a piezoelectric body disposed at an edge of the base to apply a driving force when a power is applied, the piezoelectric body having at least one friction member at one side thereof to be in contact with the tip friction member; and a preload member applying an elastic force for elastically supporting the piezoelectric actuator against the lens barrel to keep the tip friction member and the friction member in contact with each other.

The tip friction member may be disposed in a groove formed in an outer surface of the lens barrel.

The base may have a pocket where the piezoelectric actuator is disposed.

The guiding part may include: a pair of barrel guiders extended from an outer surface of the lens barrel toward an inner surface of the base; a pair of base guiders extended from the inner surface of the base toward the lens barrel; and a pair of bearing members disposed between each of the barrel guiders and each of the base guiders, respectively.

The pair of barrel guiders may be horizontally symmetrical with respect to the tip friction member and the pair of base guiders are horizontally symmetrical with respect to the piezoelectric actuator.

The pair of barrel guiders may include upper and lower stopping portions formed on one side thereof opposing the pair of base guiders to correspond to top and bottom of each of bearing members.

A height between the upper and lower stopping portions may be greater than a height of the bearing member.

Each of the bearing members may include: at least one ball member being in point contact with an outer surface of a corresponding one of the barrel guiders and an outer surface of a corresponding one of the base guiders; and a retainer having a ball receiving groove where the ball member is rotatably disposed.

The preload member may include: upper and lower stopping portions fixedly stuck on top and bottom of the base; and a vertical elastic surface connecting the upper and lower stopping portions to each other and abutting an outer surface of the piezoelectric actuator opposing the friction member, the vertical elastic surface elastically supporting the piezoelectric actuator against the lens barrel.

The upper and lower stopping portions may be bent so as to be stuck on the top and bottom of the base, respectively.

The vertical elastic surface may include an embossing part protruded so as to be in point contact with the outer surface of the piezoelectric actuator.

A contact point between the preload member and the piezoelectric actuator and a contact point between the tip friction member and the friction member may be aligned along a virtual line.

A contact point between the preload member and the piezoelectric actuator and the bearing members disposed at both sides of the friction receiving part may be aligned along a virtual line, respectively.

The base further may include a location sensor sensing vertical movement of a sensing part provided on the lens barrel and detecting vertical movement amount of the lens barrel.

The base may be provided on a top thereof with a cover having an exposure opening for exposing the lens to the outside.

The base may be provided with a board having an image sensor electrically mounted thereon, the image sensor imaging light passed through the lens.

BRIEF DESCRIPTION OF THE DRAWINGS

The above and other aspects, features and other advantages of the present invention will be more clearly understood from the following detailed description taken in conjunction with the accompanying drawings, in which:

FIG. 7A is a plan view and FIG. 7B is perspective view illustrating a longitudinally expanded piezoelectric body of a piezoelectric actuator employed in a lens driving device according to an exemplary embodiment of the invention;

DETAILED DESCRIPTION OF THE PREFERRED EMBODIMENT

Exemplary embodiments of the present invention will now be described in detail with reference to the accompanying drawings.

Figure 1:
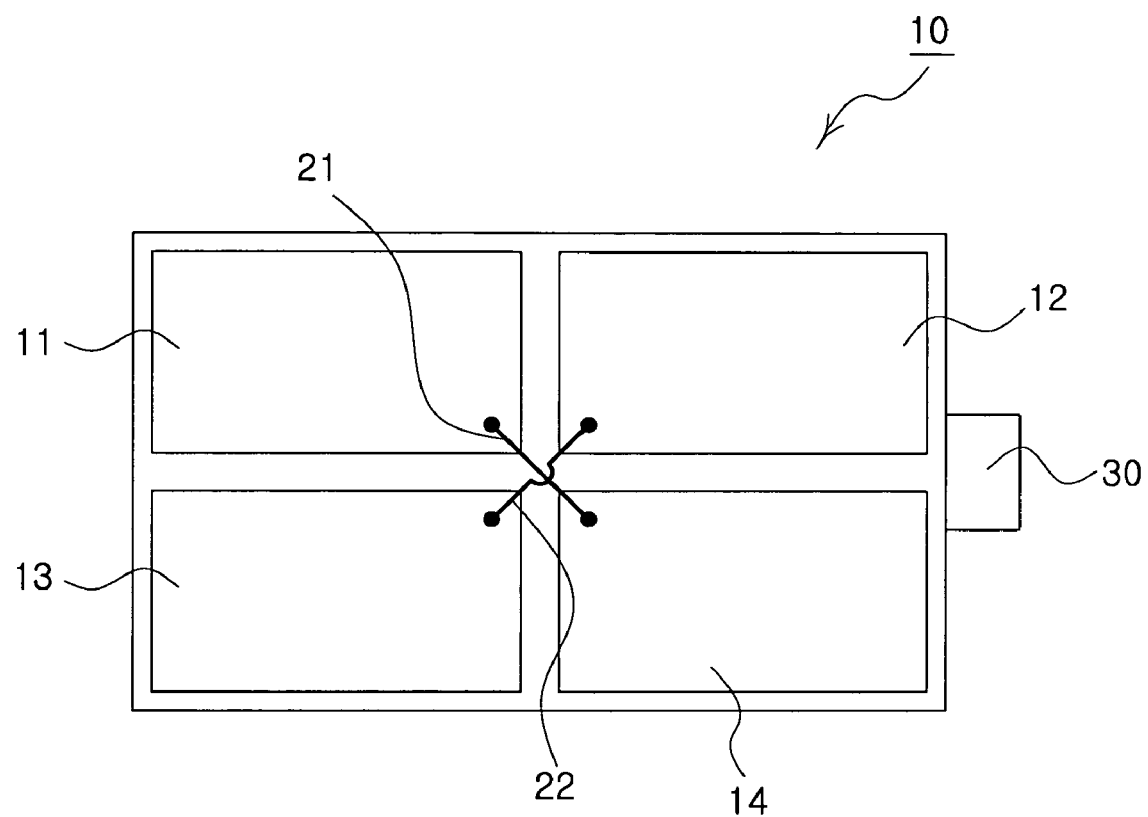
FIG. 1 is a schematic view illustrating a structure of a conventional piezoelectric actuator.
Figure 2:
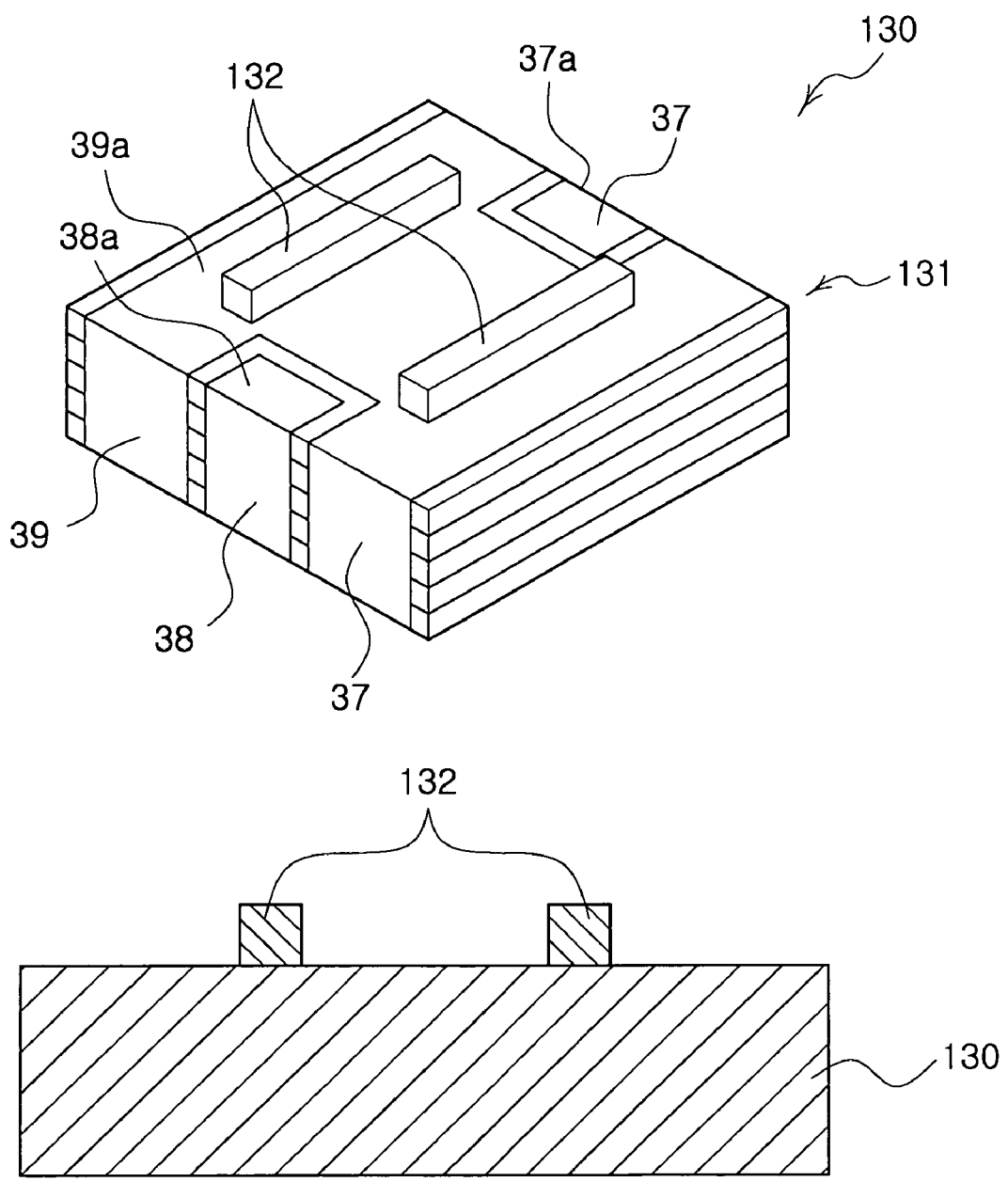
FIG. 2 is a perspective view illustrating a piezoelectric actuator according to a first embodiment of the present invention.
Figure 3:
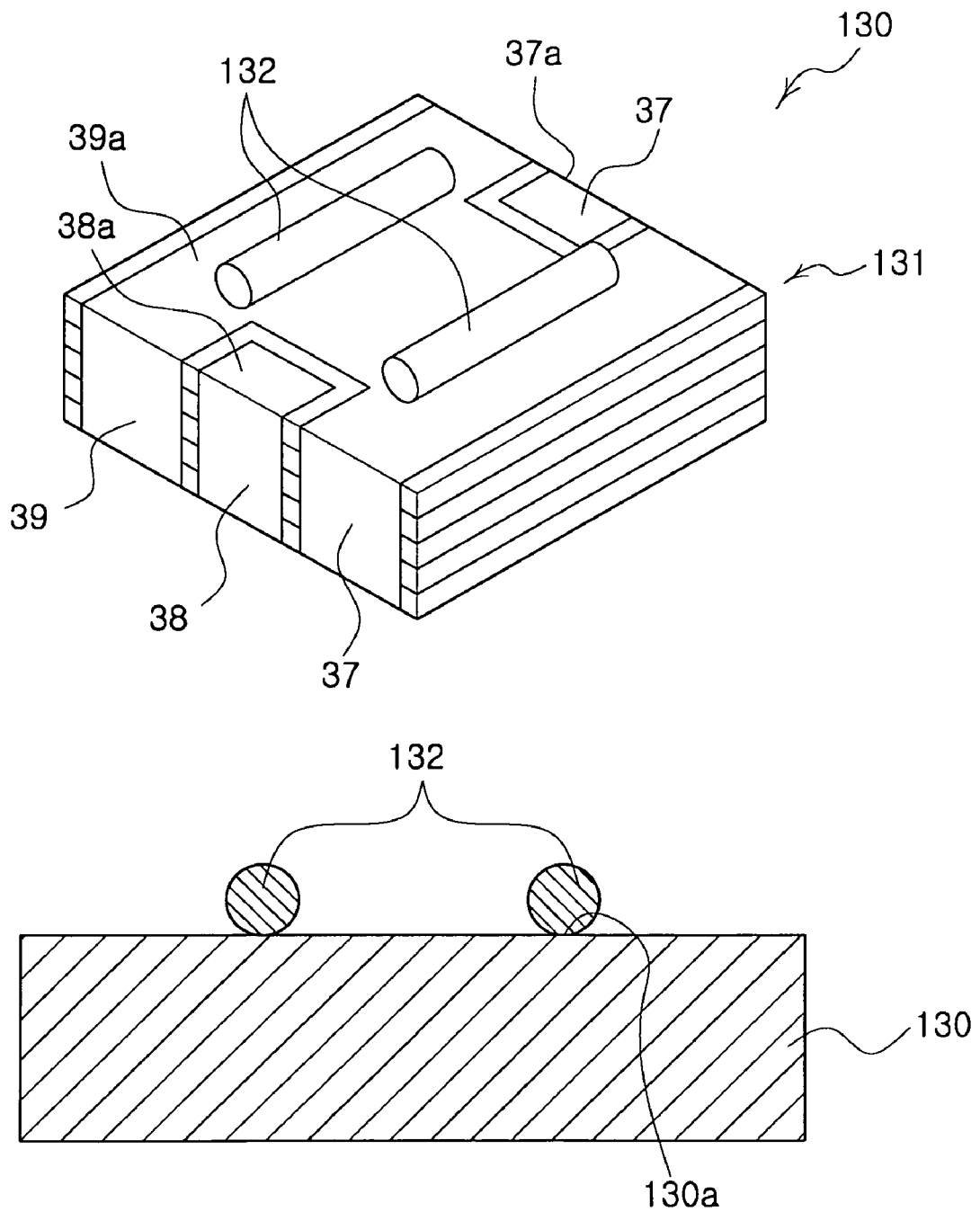
FIG. 3 is a perspective view illustrating a piezoelectric actuator according to a second embodiment of the present invention.
Figure 4:
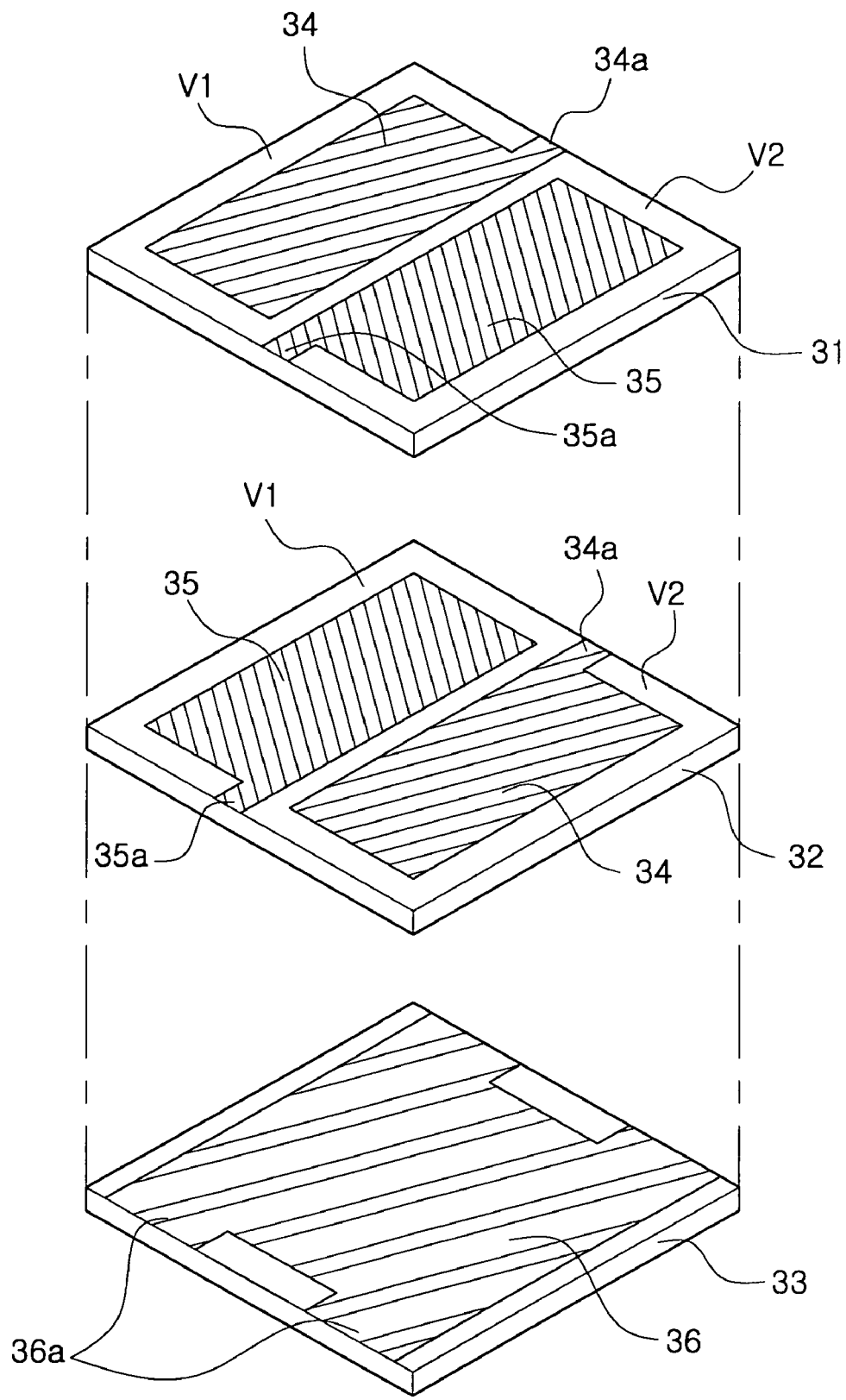
FIG. 4 is an exploded perspective view employed in a piezoelectric actuator according to an exemplary embodiment of the invention.
Figure 5:
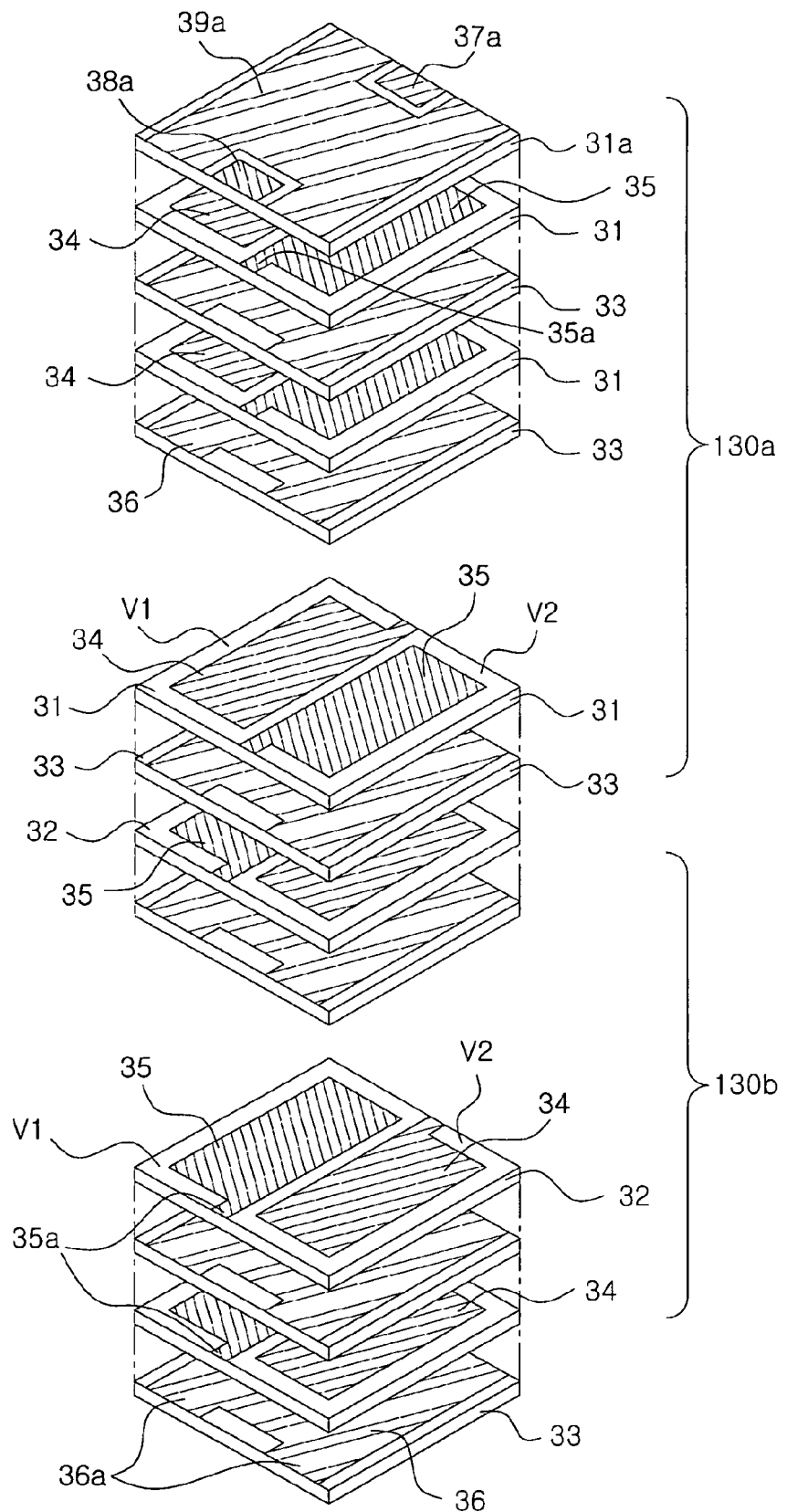
FIG. 5 is an exploded perspective view illustrating first and second piezoelectric bodies employed in a piezoelectric actuator according to an exemplary embodiment of the invention.

FIG. 2 is a perspective view illustrating a piezoelectric actuator according to a first embodiment of the present invention. FIG. 3 is a perspective view illustrating a piezoelectric actuator according to a second embodiment of the present invention. FIG. 4 is an exploded perspective view employed in a piezoelectric actuator according to an exemplary embodiment of the invention. FIG. 5 is an exploded perspective view illustrating first and second piezoelectric bodies employed in a piezoelectric actuator according to an exemplary embodiment of the invention.

The piezoelectric actuator 130 includes a piezoelectric body 131, a friction member 132 and an electrode part 133.

The piezoelectric body 131 includes first ceramic sheets 31 and 32 having first and second internal electrodes 34 and 35 spaced apart from each other at a predetermined distance on one side thereof and a second ceramic sheet 33 having a ground electrode 36 pattern-printed on one side thereof. The piezoelectric body 131 is a rectangular parallelepiped structure having these first and second ceramic sheets 31, 32, and 33 stacked alternately in a stack direction.

The piezoelectric body 131 includes a first vibration part V1 and a second vibration part V2 separated from each other at a predetermined distance by the first and second internal electrodes 34 and 35. The first and second internal electrodes 34 and 35 each are selectively disposed on the first vibration part V1 and the second vibration part V2.

Also, the piezoelectric body 131 includes a first piezoelectric body 130a and a second piezoelectric body 130b disposed therebelow. As shown in FIG. 5, the first piezoelectric body 130a has the first internal electrode 34 pattern-printed on each of the plurality of first ceramic sheets 31 superimposed on a portion corresponding to the first vibration part V1 and has the second internal electrode 35 superimposed on a portion corresponding to the second vibration part V2. Also, a third ceramic sheet 33 having a ground electrode 36 pattern-printed on one side thereof is stacked between the first ceramic sheets 31 and 32.

On the contrary, the second piezoelectric body 130b has the first internal electrode 34 pattern-printed on another one of the first ceramic sheets 32 superimposed on a portion corresponding to the second vibration part V2 and has the second internal electrode 35 superimposed on a portion corresponding to the first vibration part V1. Moreover, the third ceramic sheet 33 having the ground electrode 36 pattern-printed on one side thereof is stacked between the first ceramic sheets 31 and 32.

Also, the electrode part 133 includes first and second external electrodes 37 and 38, and a ground external electrode 39. The first external electrode 37 is formed on an outer surface of one side of the piezoelectric body 131 to connect to a terminal of the first internal electrode 34. Meanwhile, the second external electrode 38 is formed on an outer surface of another side of the piezoelectric body 131 to connect to a terminal 35a of the second internal electrode 35.

Also, the ground external electrode 39 is formed on the outer surface of the piezoelectric body 131 to connect to a terminal 36a of the ground electrode 36.

Here, the terminals 34a, 35a, and 36a extended from the first and second internal electrodes 34 and 35 and the ground electrode 36 are extended to outer edges of the first and second ceramic sheets 31, 32 and 33 to be electrically connected to the first and second external electrodes 37 and 38 and the external ground electrode 39 formed on the outer surface of the piezoelectric body 131, respectively.

Out of the plurality of ceramic sheets constituting the piezoelectric body 131, the ceramic sheet located as an uppermost layer has a first channel electrode 37a, a second channel electrode 38a and an internal ground electrode 39a pattern-printed thereon. The first channel electrode 37a is electrically connected to the first external electrode 37, the second channel electrode 38a is electrically connected to the second external electrode 38 and the ground external electrode 39 is electrically connected to the ground external electrode 39.

Figure 11:
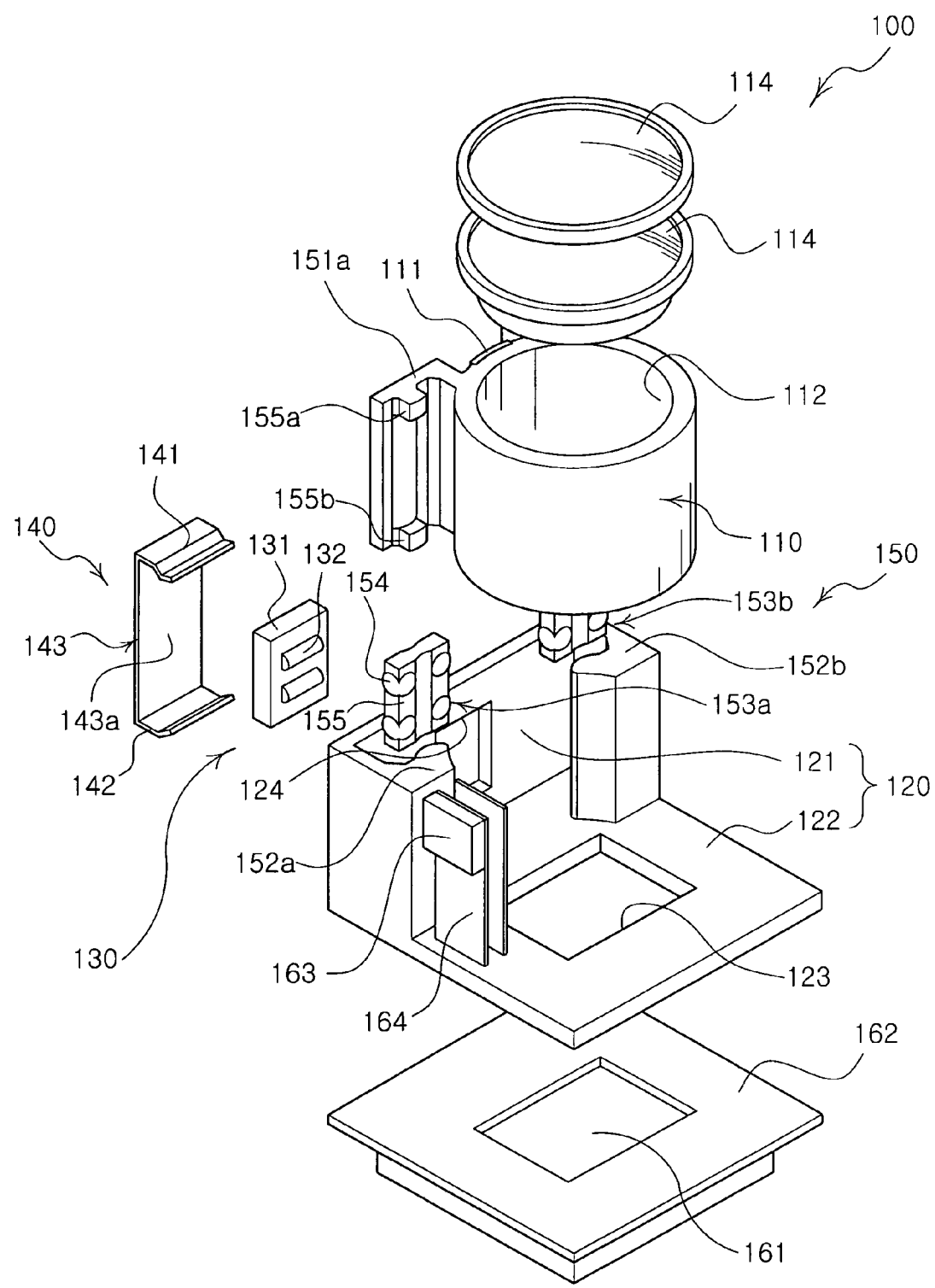
FIG. 11 is an exploded perspective view illustrating a lens driving device according to an exemplary embodiment of the invention.
Figure 12:
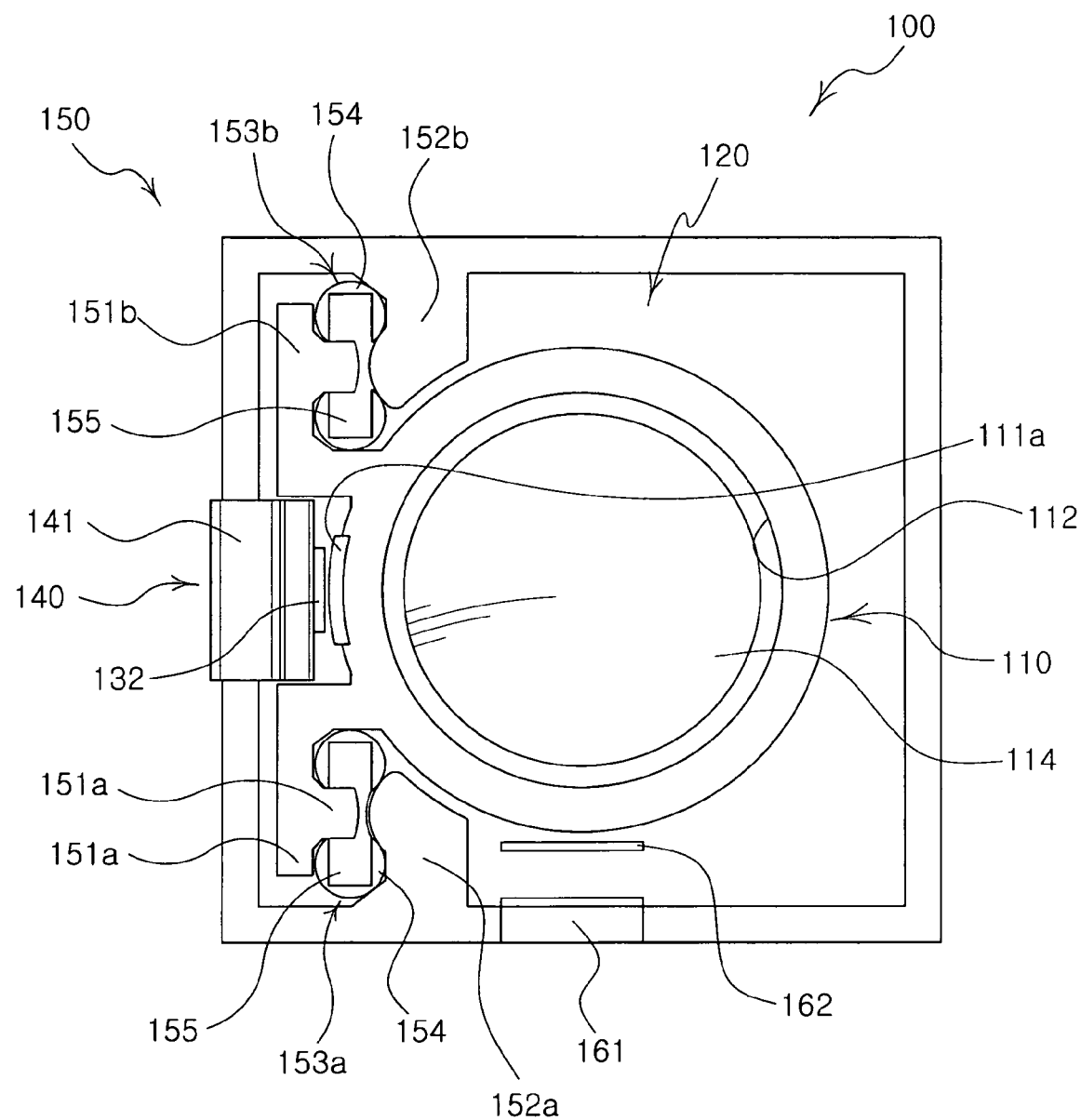
FIG. 12 is a plan view illustrating a lens driving device according to an exemplary embodiment of the invention.
Figure 13:
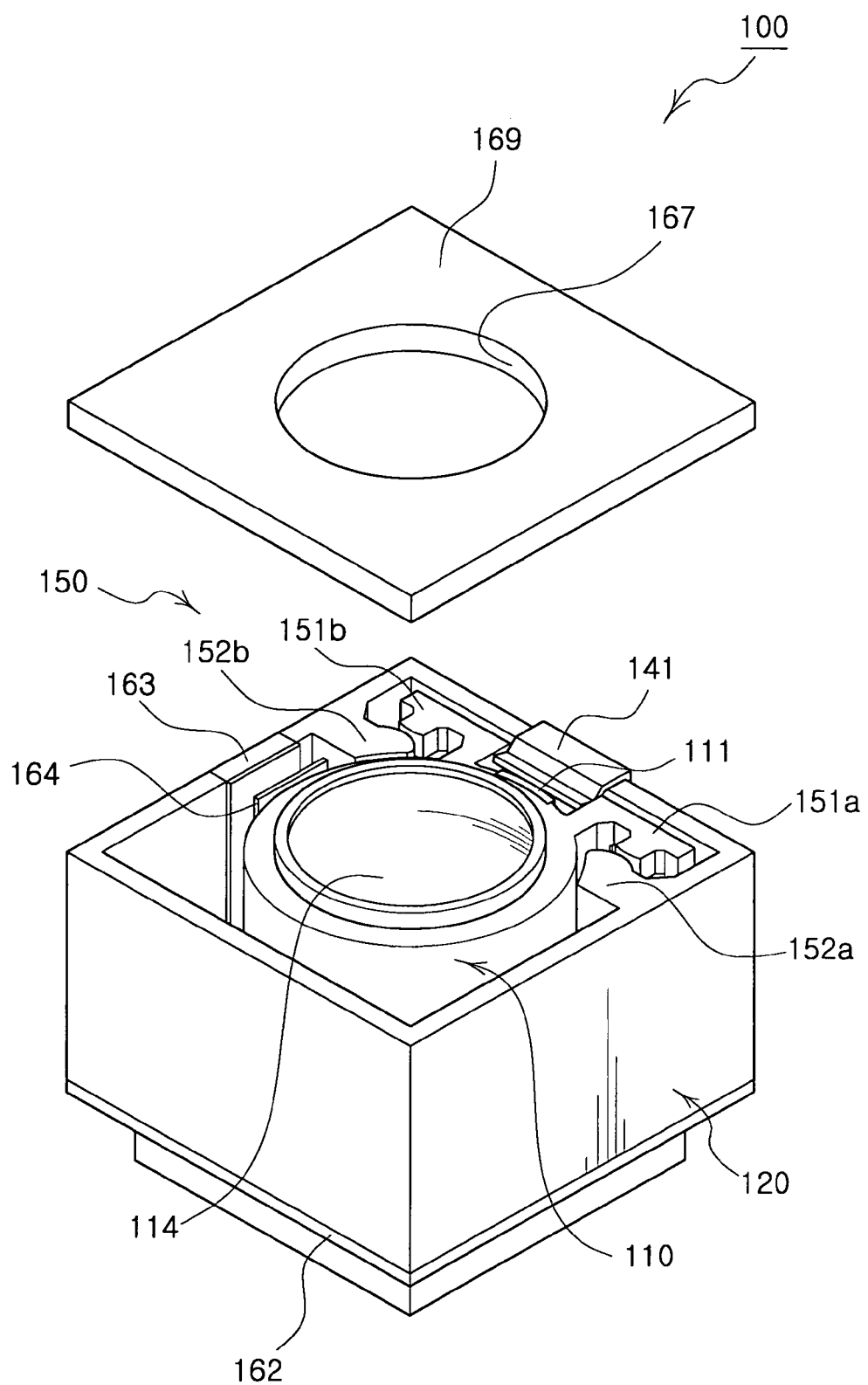
FIG. 13 is an exterior view illustrating a lens driving device according to an exemplary embodiment of the invention.
Figure 14:
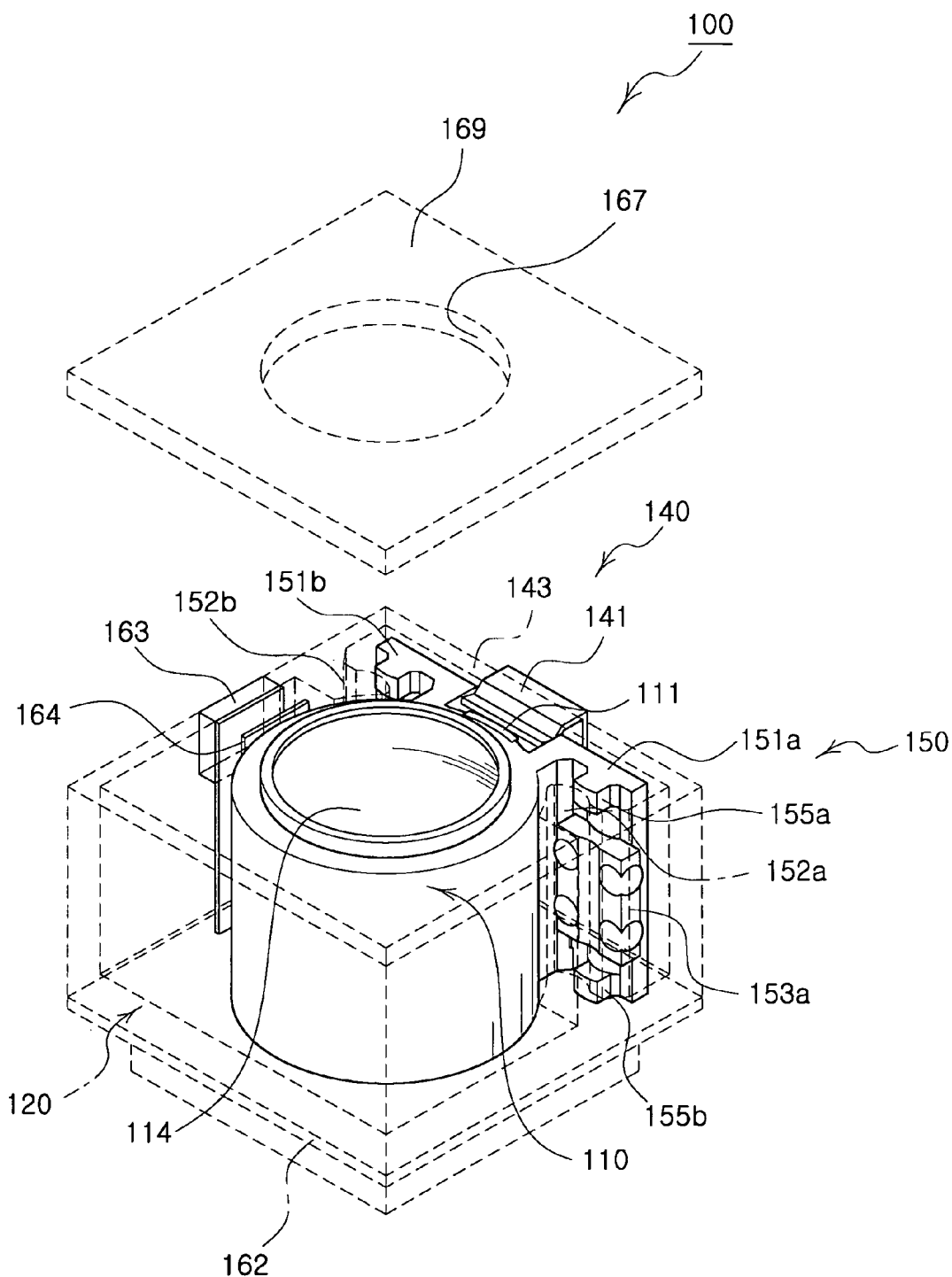
FIG. 14 is a perspective view illustrating a lens driving device according to an exemplary embodiment of the invention.

FIG. 11 is an exploded perspective view illustrating a lens driving device according to an exemplary embodiment of the invention. FIG. 12 is a plan view illustrating a lens driving device according to an exemplary embodiment of the invention. FIG. 13 is an exterior view illustrating a lens driving device according to an exemplary embodiment of the invention. FIG. 14 is a perspective view illustrating a lens driving device according to an exemplary embodiment of the invention.

As shown in FIGS. 11 to 14, the lens driving device 100 of the present embodiment includes a lens barrel 110, a base 120, a piezoelectric actuator 130, a preload member 140.

Lens Barrel

As shown in FIGS. 11 to 14, the lens barrel 110 is a hollow cylindrical structure having a lens hole 112 of a predetermined size formed therein to have at least one lens 114 disposed therein along an optical axis.

A tip friction member 111 is formed on an outer surface of the lens barrel 110 to be parallel with the optical axis direction. The tip friction member 111 is inserted into a groove 111a recessed to a predetermined depth from an outer surface of the lens barrel 110 and then fixedly bonded to the groove 111a by a bonding material.

Here, the tip friction member 111 may be formed of alumina, ceramic or a metallic material such as super alloy and high speed steel having excellent wear resistance and a relatively large friction coefficient.

Base

As shown in FIGS. 1 to 4, the base 120 is a fixed structure including a guiding part 150 guiding the lens barrel 110 to be reciprocally movable in an optical axis direction.

This base 120 includes an upper body 121 where the guiding part 150 is formed and a lower body 122 where a board 62 having an image sensor 161 mounted thereon is disposed.

Also, the upper body 121 has a pocket 124 formed therein to have the piezoelectric actuator 130 disposed therein. The piezoelectric actuator 130 is movably disposed in the pocket 124.

Here, the lower body 122 is formed of a plate-type member defining a bottom surface of the base 120. As shown, the lower body 122 has the board 162 having the image sensor 161 thereon assembled to the bottom surface thereof, and an exposure opening 123 for exposing the image sensor 161 upward. But the present invention is not limited thereto. The board 162 having the image sensor 161 thereon may be disposed on a top surface of the lower body 122.

The guiding part 150 includes a pair of barrel guiders 151a and 151b, a pair of base guiders 152a and 152b and a pair of bearing members 153a and 153b. The barrel guiders 151a and 151b are extended in a predetermined length from an outer surface of the lens barrel 110 toward an inner surface of the base 120. The base guiders 152a and 152b are extended in a predetermined length from the inner surface of the base 120 toward the lens barrel 110. The bearing members 153a and 153b are disposed between each of the barrel guiders 151a and 151b and each of the base guiders 152a and 152b, respectively.

Here, the pair of barrel guiders 151a and 151b are protrusions extended in a predetermined direction from the outer surface of the lens barrel 110 toward the inner surface of the base 120. The barrel guiders 151a and 151b are horizontally symmetrical about the tip friction member 111.

The pair of base guiders 152a and 152b are protrusions extended from the inner surface of the base 120 opposing the base guiders 152a and 152b toward the outer surface of the lens barrel 110. The base guiders 152a and 152b are horizontally symmetrical about the piezoelectric actuator 130.

Moreover, each of the bearing members 153a and 155b includes at least one ball member 154 brought in point contact with an outer surface of the barrel guiders 151a and 151b, and an outer surface of the base guiders 152a and 152b, and a retainer 155 having a ball receiving groove where the ball member is rotatably disposed.

The barrel guiders 151a and 151b each include upper and lower stopping portions 155a and 155b formed on one side opposing the base guiders 152a and 152b to correspond to top and bottom of the each of the bearing members 153a and 153b.

Here, a height between the upper stopping portion 155a and the lower stopping portion 155b may be greater than a height of the bearing members 153a and 153b disposed between each of the barrel guiders 151a and 151b and each of the base guiders 152a and 152b, respectively.

Piezoelectric Actuator

As shown in FIGS. 1 to 4, the piezoelectric actuator 130 includes at least one friction member 132 in contact with the tip friction member 111 of the lens barrel 110 to generate a frictional force, and a piezoelectric body 131 having the friction member formed integrally on one side thereof. The piezoelectric actuator 130 with this configuration is disposed in the pocket 124 formed in the base to provide a driving force for driving the lens barrel 110, an object of transport, to be moved in an optical axis direction with respect to the base 120 when a power having a preset frequency is applied.

Here, the piezoelectric body 131 has a plurality of external electrodes provided on an outer surface thereof. In response to a power applied through the external electrodes, the piezoelectric body 131, which is composed of a plurality of stacked piezoelectric sheets each having particular internal electrodes, produces a dilation mode in a longitudinal direction and a flexural mode, or bending mode in a thickness direction.

Also, the friction member 132 may be fixed to the outer surface of the piezoelectric body 131 opposing the lens barrel 110 by a bonding material. Alternatively, the friction member 132 may be fixed to a recess formed in the outer surface of the piezoelectric body 131 opposing the lens barrel 110 by a bonding material.

Like the tip friction member 111, the friction member 132 may be formed of alumina, ceramic or a metallic material such as super alloy and high speed steel having excellent wear resistance and a relatively large friction coefficient. The shape of the friction member 132 is not limited to a cylinder but may be a semicircular cylinder and a box as long as the shape allows transfer of a frictional force to a corresponding object.

Here, the piezoelectric actuator 130 is illustrated to be disposed in the pocket 124 formed in one side of the base 120, but the present invention is not limited thereto. The piezoelectric actuator 130 may be disposed between the inner surface of the base 120 and the outer surface of the lens barrel 110.

Preload Member

As shown in FIGS. 1 to 4, the preload member 140 is an elastomer fixed to the base 120 and compressing the piezoelectric actuator 130 against the lens barrel 110 to apply an elastic force of a predetermined magnitude so that the tip friction member 112 of the lens barrel 110 and the friction member 132 of the piezoelectric actuator 130 are kept in contact with each other.

The preload member 140 is of a leaf spring which applies an elastic force toward the piezoelectric actuator 130. When the preload member 140 is formed of at least one leaf spring, upper and lower stopping portions 141 and 142 of the preload member 140 are stuck on top and bottom of the base 120. Also, a vertical elastic surface 143 connecting the upper and lower stopping portions 141 and 142 together is in contact with an outer surface of the piezoelectric actuator 130 opposing the friction member 132 to elastically support the piezoelectric actuator 130 against the lens barrel 110.

Here, the upper and lower stopping portions 141 and 142 of the preload member 140 may be bent inwardly to be fixedly stuck in the top and bottom of the base 120. The vertical elastic surface 143 may have an embossing part 143a protruded to be in point contact with the outer surface of the piezoelectric actuator 130.

Furthermore, the preload member 140 is illustrated to be formed of the leaf spring but the present invention is not limited thereto. The preload member 140 may be formed of at least one coil spring. In a case where the preload member 140 is formed of the coil spring, the preload member 140 has one end in contact with a vertical inner surface of the base 120 and another end in contact with the outer surface of the piezoelectric actuator 130. Here, the piezoelectric actuator 130 is disposed between the vertical outer surface of the base 120 and the preload member, and there is no need to additionally form the pocket 124 in the base 120.

Meanwhile, a contact point between the preload member 140 and the piezoelectric actuator 130 and a contact point between the tip friction member 111 and the friction member 132 are aligned along a virtual line. In this case, the driving force generated from the piezoelectric actuator 130 is transferred to the tip friction member 111 through the friction member 132 without any loss. This allows the lens barrel 110 to be reciprocally movable in an optical axis direction and to be minimized in loss of the driving force when moved reciprocally.

Also, the contact point between the preload member 140 and the piezoelectric actuator 130 and the bearing members 153a and 153b disposed on both sides of the tip friction member 111 may be aligned along a virtual line, respectively. Here, a spacing among the guiding part 150 formed on the base 120 and the lens barrel 110 and piezoelectric actuator 130 can be approximated as much as possible to reduce the bulk and size of the lens driving apparatus maximally.

Meanwhile, a location sensor 163 is provided on the outer surface of the lens barrel 110. The location sensor 163 irradiates light emitted to a reflective surface of a sensing part 164 moving along with the location sensor 163, receives reflected light, and senses vertical positional change of the sensor 164 to detect vertical movement amount of the lens barrel 110. This location sensor 163 is electrically connected to a cable (not shown) to apply a power and transfer a detected signal to a controller.

The lens barrel 110, the piezoelectric actuator 130 and the guiding part 150 disposed inside the base 120 can be protected from external environment.

Also, the base 120 includes a board 160 having the image sensor 165 mounted thereon to image light passed through the lens 114 of the lens barrel 110.

Figure 10A:
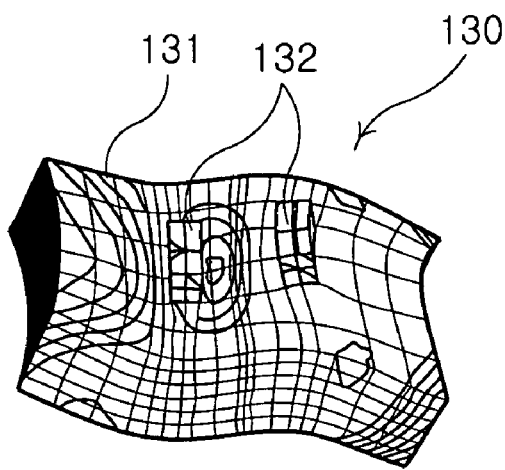
FIGS. 10A and 10B are perspective views illustrating combined modes of a piezoelectric body of a piezoelectric actuator employed in a lens driving device according to an exemplary embodiment of the invention.
Figure 10B:
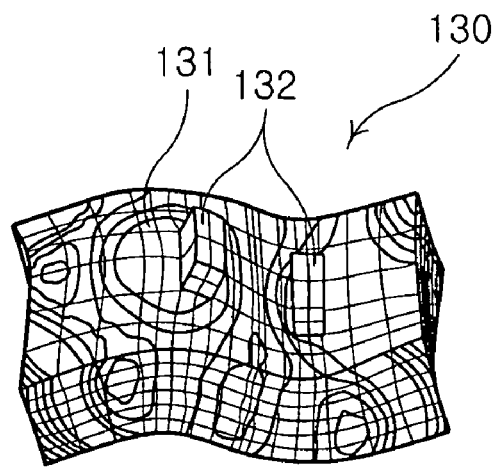

In the lens driving device 100, the lens barrel 110 with at least one lens disposed therein is moved reciprocally in the optical axis direction by the driving force for moving the lens barrel 110 generated by longitudinal (dilation) and bending modes of vibration of the piezoelectric body 131, in response to an external power applied. That is, the piezoelectric body 131 is dilated in a longitudinal direction by a dilation mode, as shown in FIGS. 7A and 7B, is contracted in a longitudinal direction and is bent in a thickness direction by a flexural or bending mode. With the dilation mode and bending mode combined as shown in FIGS. 10 and 11, the piezoelectric body 131 generates the driving force for driving the lens barrel in the optical axis direction.

That is, when the piezoelectric body of the piezoelectric actuator is simultaneously driven at a resonant frequency of at least 620 kHz in an ultrasonic region, the friction member 132 of the piezoelectric body 131 corresponding to the tip friction member 111 of the lens barrel moves along elliptical locus or path.

A direction of the elliptical locus movement is determined by voltages applied to internal and external electrodes of the piezoelectric body. This in turn enables adjustment of the transport direction of the lens.

That is, when an electrical signal is applied to the first channel electrode 37a, the signal is applied to the first internal electrode superimposed on a left side of each of the first ceramic sheets constituting the first piezoelectric body 130a to activate the first vibration part. At the same time, the signal is applied to the first internal electrode superimposed on a right side of the each of the first ceramic sheets constituting the second piezoelectric body 130a to activate the second vibration part. On the other hand, when the electrical signal is applied to the second channel electrode 38a, the signal is applied to the second internal electrode superimposed on the right side of the each of the first ceramic sheets constituting the first piezoelectric body 130a to activate the second vibration part. At the same time, the signal is applied to the second internal electrode corresponding to the left side of the each of the first ceramic sheets constituting the second piezoelectric body 130a to active the first vibration part.

Therefore, when the power is selectively applied through the first and second channel electrodes, the piezoelectric body having a multi-layer stack of the piezoelectric ceramic sheets performs the dilation mode in a longitudinal direction and the bending mode in a thickness direction. Thus, the friction member provided on the piezoelectric body moves along an elliptical path, making a motion in an upward or downward direction.

Figure 6:
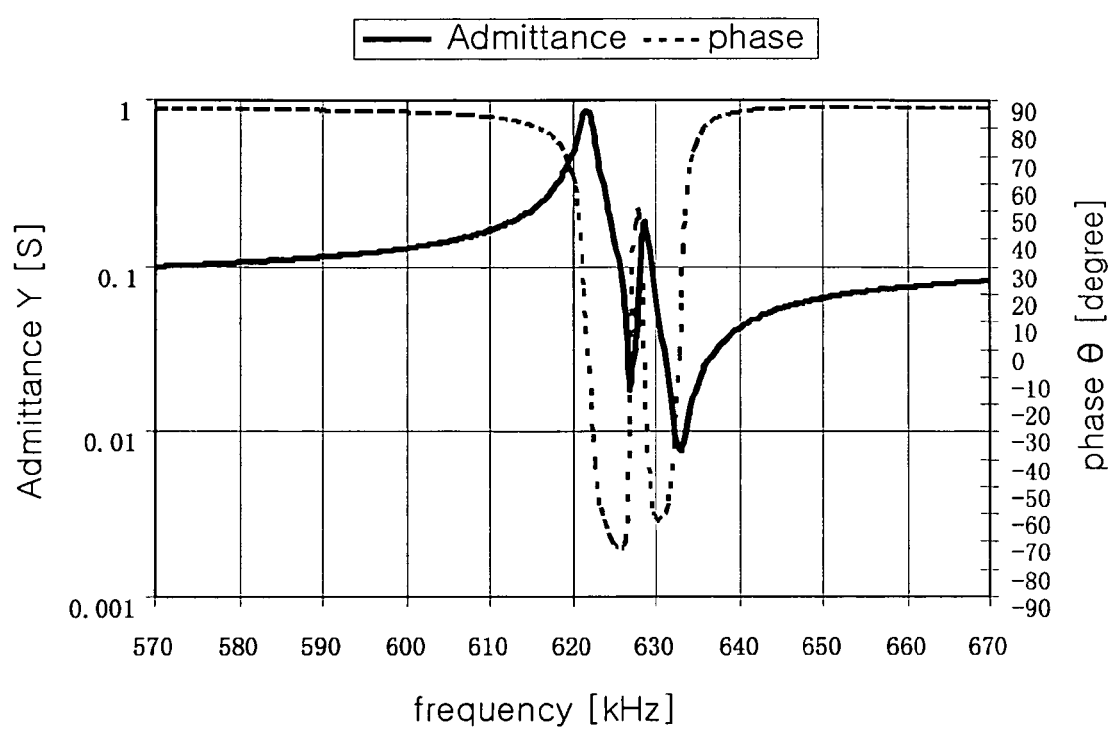
FIG. 6 is a graph illustrating changes in admittance and phase with respect to frequency in a piezoelectric actuator employed in a lens driving device according to an exemplary embodiment of the invention.

FIG. 6 is a graph illustrating a change in admittance with respect to frequency in a piezoelectric actuator employed in a lens driving device of the present invention.

As shown in FIG. 6, a dilation mode has a resonant frequency around 622 kHz and an anti-resonant frequency around 633 kHz. Meanwhile, the bending mode has an anti-resonant frequency around 626 kHz and a resonant frequency around 629 kHz.

Figure 8A:
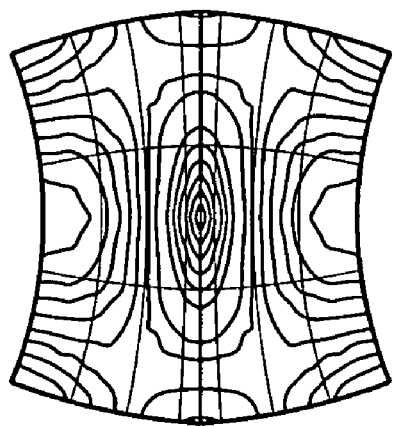
FIG. 8A is a plan view and FIG. 8B is a perspective view illustrating a longitudinally contracted piezoelectric body of a piezoelectric actuator employed in a lens driving device according to an exemplary embodiment of the invention.
Figure 8B:
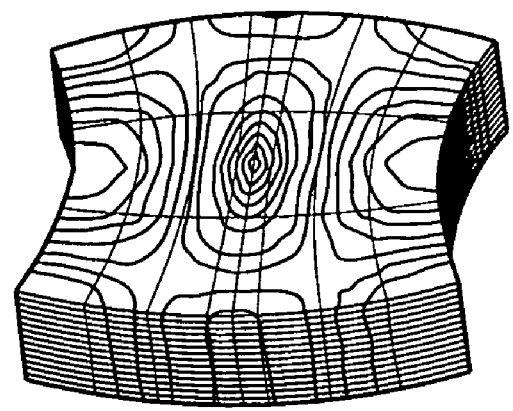
Figure 9A:
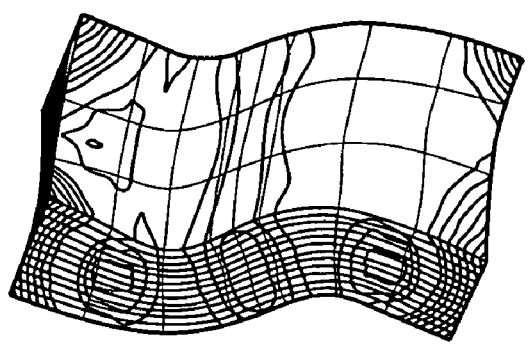
FIG. 9A is a plan view and FIG. 9B is a perspective view illustrating a bending mode of a piezoelectric body of a piezoelectric actuator employed in a lens driving device according to an exemplary embodiment of the invention.
Figure 9B:
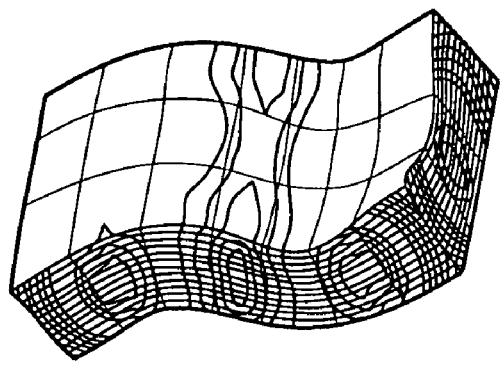

That is, the bending mode has the resonant frequency and anti-resonant frequency located between the resonant frequency and anti-resonant frequency of the dilation mode, and the resonant frequency of the dilation mode and the resonant frequency of the bending mode are kept in close proximity to each other. Thus, the piezoelectric body performs the dilation mode upon application of the electrical signal through first and second channel electrodes, as shown in FIGS. 7A and B and FIGS. 8A and 8B. The piezoelectric body performs the bending mode, as shown in FIGS. 9A and 9B.

Furthermore, when the dilation mode and bending mode are performed simultaneously, the friction member 132 disposed on the piezoelectric body 131 moves along an elliptical path, thereby generating a frictional force for moving the friction member in contact therewith in an upward or downward direction.

Here, the piezoelectric actuator 130 is elastically supported against the lens barrel 110 by the preload member to keep the tip friction member and the friction member of the lens barrel in contact with each other. Accordingly, the friction member makes only a linear motion in an upward or downward direction. The direction of the elliptical locus movement is adjusted to an upward or downward direction according to polarity of voltage applied to the piezoelectric body.

Consequently, since the friction member transfers the driving force via the tip friction member provided on the lens barrel, an object of transport, the lens barrel is elevated or lowered along the optical axis direction by the bearing members of the guiding part.

Here, the frictional force generated between the friction member and the tip friction member is greater than the frictional force generated from the bearing members. This allows the lens barrel to move reciprocally in the optical axis direction.

Moreover, the friction member and tip friction member are kept in constant contact with each other by an elastic force of the preload member elastically compressing the piezoelectric actuator against the lens barrel.

In addition, the reciprocal movement of the lens barrel is detected by the location sensor sensing a sensing part of the lens barrel. Based on the detected amount of movement, the lens barrel can move along the optical axis direction by a suitably-controlled driving force of the piezoelectric body.

As set forth above, according to exemplary embodiments of the invention, in a lens driving, a piezoelectric actuator has a tip friction member in contact with a lens barrel. A preload member is provided to compress the piezoelectric actuator against the lens barrel and a guiding part is provided between the lens barrel and a base to guide the lens barrel in an optical axis direction. The lens device with this structure has a linear driving mechanism for transferring a driving force of the piezoelectric actuator toward the lens barrel, thereby more simplified in structure than a driving mechanism using a cam or electromagnetic device. This accordingly allows the driving device to be reduced in size.

Moreover, this piezoelectric linear driving mechanism leads to minimal loss in a driving force transferred to the lens barrel, an object of transport and also minimal loss from a frictional force when the lens driving device is driven. This allows considerable driving distance at a low input voltage and enhances driving efficiency.

In addition, the lens driving device is simplified in a guiding mechanism for driving a lens, and can ensure accurate and stable transport of the lens. This simplifies an assembly process and saves manufacturing costs.

While the present invention has been shown and described in connection with the exemplary embodiments, it will be apparent to those skilled in the art that modifications and variations can be made without departing from the spirit and scope of the invention as defined by the appended claims.

What is claimed is:

1. A piezoelectric actuator comprising:
   a piezoelectric body having a first piezoelectric body and a second piezoelectric body, the first piezoelectric body comprising a multi-layer stack of a plurality of first ceramic sheets and a second ceramic sheet having a pattern-printed ground electrode interposed therebetween, the plurality of first ceramic sheets having first and second internal electrodes pattern-printed to be spaced apart from each other at a predetermined distance each arranged such that the first internal electrode is superimposed on a first vibration part and the second internal electrode is superimposed on a second vibration part;
   a second piezoelectric body comprising a multi-layer stack of the plurality of first ceramic sheets and the second ceramic sheet interposed therebetween, the plurality of first ceramic sheets each arranged such that the first internal electrode is superimposed on a second vibration part and the second internal electrode is superimposed on a first vibration part; and
   an electrode part comprising a first external electrode, a second external electrode and a ground external electrode, the first external electrode formed on an outer surface of the piezoelectric body to connect to a terminal of the first internal electrode, the second external electrode formed on the outer surface of the piezoelectric body to connect to a terminal of the second internal electrode, and the ground external electrode formed on the outer surface of the piezoelectric body to connect to a terminal of the ground electrode; and
   a friction member disposed on the outer surface of the piezoelectric body to transfer vibration generated from the piezoelectric body to the outside.

2. The piezoelectric actuator of claim 1, wherein the piezoelectric body further comprises a ceramic sheet disposed as an uppermost layer, the ceramic sheet comprising first and second channel electrodes and an internal ground electrode pattern-printed thereon, the first channel electrode connected to the first external electrode, the second channel electrode connected to the second external electrode and the internal ground electrode connected to the ground external electrode.

3. The piezoelectric actuator of claim 1, wherein the friction member is disposed on one of outer surfaces of the piezoelectric body having a maximum area.

4. The piezoelectric actuator of claim 1, wherein the friction member is disposed on a recess formed in one of outer surfaces of the piezoelectric body having a maximum area.

5. The piezoelectric actuator of claim 1, wherein the terminal of the first internal electrode opposes the terminal of the second internal electrode.

6. A lens driving device comprising:
   a lens barrel having a lens hole where at least one lens is disposed, and having a tip friction member on an outer surface thereof;
   a base having a guiding part guiding the lens barrel to move along an optical axis direction, the guiding part comprising a pair of barrel guiders extended from an outer surface of the lens barrel toward an inner surface of the base, a pair of base guiders extended from the inner surface of the base toward the lens barrel and a pair of bearing members disposed between each of the barrel guiders and each of the base guiders, respectively;
   a piezoelectric actuator having a piezoelectric body disposed at an edge of the base to apply a driving force when a power is applied, the piezoelectric body having at least one friction member at one side thereof to be in contact with the tip friction member; and
   a preload member applying an elastic force for elastically supporting the piezoelectric actuator against the lens barrel to keep the tip friction member and the friction member in contact with each other.

7. The lens driving device of claim 6, wherein the tip friction member is disposed in a groove formed in an outer surface of the lens barrel.

8. The lens driving device of claim 6, wherein the base has a pocket where the piezoelectric actuator is disposed.

9. The lens driving device of claim 6, wherein the pair of barrel guiders are horizontally symmetrical with respect to the tip friction member and the pair of base guiders are horizontally symmetrical with respect to the piezoelectric actuator.

10. The lens driving device of claim 9, wherein the pair of barrel guiders each comprise upper and lower stopping portions formed on one side thereof opposing the pair of base guiders to correspond to top and bottom of each of bearing members.

11. The lens driving device of claim 10, wherein a height between the upper and lower stopping portions is greater than a height of the bearing member.

12. The lens driving device of claim 6, wherein each of the bearing members comprises:
   at least one ball member being in point contact with an outer surface of a corresponding one of the barrel guiders and an outer surface of a corresponding one of the base guiders; and
   a retainer having a ball receiving groove where the ball member is rotatably disposed.

13. The lens driving device of claim 6, wherein a contact point between the preload member and the piezoelectric actuator and a contact point between the tip friction member and the friction member are aligned along a virtual line.

14. The lens driving device of claim 6, wherein a contact point between the preload member and the piezoelectric actuator and the bearing members disposed at both sides of the friction receiving part are aligned along a virtual line, respectively.

15. The lens driving device of claim 6, wherein the base further comprises a location sensor sensing vertical movement of a sensing part provided on the lens barrel and detecting vertical movement amount of the lens barrel.

16. The lens driving device of claim 6, wherein the base is provided on a top thereof with a cover having an exposure opening for exposing the lens to the outside.

17. The lens driving device of claim 6, wherein the base is provided with a board having an image sensor electrically mounted thereon, the image sensor imaging light passed through the lens.

18. A lens driving device comprising:
   a lens barrel having a lens hole where at least one lens is disposed, and having a tip friction member on an outer surface thereof;
   a base having a guiding part guiding the lens barrel to move along an optical axis direction;
   a piezoelectric actuator having a piezoelectric body disposed at an edge of the base to apply a driving force when a power is applied, the piezoelectric body having at least one friction member at one side thereof to be in contact with the tip friction member; and
   a preload member applying an elastic force for elastically supporting the piezoelectric actuator against the lens barrel to keep the tip friction member and the friction member in contact with each other,
   wherein the preload member comprises
      upper and lower stopping portions fixedly stuck on top and bottom of the base; and
      a vertical elastic surface connecting the upper and lower stopping portions to each other and abutting an outer surface of the piezoelectric actuator opposing the friction member, the vertical elastic surface elastically supporting the piezoelectric actuator against the lens barrel.

19. The lens driving device of claim 18, wherein the upper and lower stopping portions are bent so as to be stuck on the top and bottom of the base, respectively.

20. The lens driving device of claim 18, wherein the vertical elastic surface comprises an embossing part protruded so as to be in point contact with the outer surface of the piezoelectric actuator.

* * * * *